(12) United States Patent
Vasquez et al.

(10) Patent No.: US 10,018,688 B1
(45) Date of Patent: Jul. 10, 2018

(54) METHOD AND APPARATUS FOR DETECTING MAGNETIC SATURATION IN AMR SENSORS

(71) Applicant: MEMSIC, INC., Andover, MA (US)

(72) Inventors: Daniel Vasquez, San Jose, CA (US); Yongyao Cai, Acton, MA (US); Shuo Gu, Andover, MA (US); James Fennelly, Stoneham, MA (US)

(73) Assignee: MEMSIC, INC., Andover, MA (US)

( * ) Notice: Subject to any disclaimer, the term of this patent is extended or adjusted under 35 U.S.C. 154(b) by 399 days.

(21) Appl. No.: 14/547,707

(22) Filed: Nov. 19, 2014

Related U.S. Application Data

(60) Provisional application No. 61/906,093, filed on Nov. 19, 2013.

(51) Int. Cl.
*G01R 15/20* (2006.01)
*G01R 33/09* (2006.01)

(52) U.S. Cl.
CPC .................. *G01R 33/096* (2013.01)

(58) Field of Classification Search
CPC .... B82Y 25/00; G01R 33/093; G01R 33/096; G01R 33/18; G01R 15/20; G01R 31/001; G01R 15/207; G01R 31/3277; G01R 33/07; G01R 33/02
See application file for complete search history.

(56) References Cited

U.S. PATENT DOCUMENTS

| | | | | |
|---|---|---|---|---|
| 6,822,443 B1* | 11/2004 | Dogaru | ................. | G01R 33/093 324/235 |
| 2009/0295382 A1* | 12/2009 | Sterling | ............... | G01R 33/091 324/252 |
| 2011/0227569 A1* | 9/2011 | Cai | ........................ | B82Y 25/00 324/252 |
| 2012/0169328 A1* | 7/2012 | Williams | ............... | G01R 15/20 324/251 |

* cited by examiner

*Primary Examiner* — Jermele M Hollington
*Assistant Examiner* — Brent J Andrews
(74) *Attorney, Agent, or Firm* — Preti Flaherty Beliveau & Pachios LLP

(57) ABSTRACT

Systems and methods to detect when the external magnetic field becomes higher than the saturation field of AMR material are described. Approaches include saturation detection by combining sensors with different full-scale ranges, saturation detection using DC current and saturation detection by arranging sensitive axes at 45° offsets.

19 Claims, 14 Drawing Sheets

METHOD AND APPARATUS FOR DETECTING MAGNETIC SATURATION IN AMR SENSORS

RELATED APPLICATION

This application is a non-provisional patent application based on U.S. Provisional Patent Application Ser. No. 61/906,093 filed on Nov. 19, 2013 and titled "Magnetic Sensor Saturation Detection," the entire contents of which is incorporated by reference herein for all purposes.

BACKGROUND OF THE INVENTION

As is well known, the demand for magnetic field sensors for mobile devices, such as mobile phones, personal navigation devices, smart watches, etc., to implement electronic compass applications, such as providing step-by-step directions, has been increasing rapidly as GPS functionality is now found in many of these devices.

There are many different types of magnetic field sensors and those based on anisotropic magnetoresistive (AMR) technology are also well known. An AMR sensor operates on the principle that there are some materials, e.g., permalloy, that exhibit a resistance that is dependent on the orientation of the magnetization of the material. In most AMR materials, the resistance of the material is highest when the current in the material is running parallel with the magnetization vector as shown in FIG. 1a. Examples of such technology are described in U.S. Pat. Nos. 4,847,584; 5,247,278; 5,521,501; 5,952,825 and 8,525,514, each of which is herein incorporated by reference for all purposes.

In an AMR device, a thin film permalloy material is deposited on a silicon wafer while a strong magnetic field is applied to create permalloy resistors. The magnetic domains of these permalloy resistors are aligned in the same direction as the applied field thereby establishing a magnetization vector. Subsequent lithographic and etching steps define the geometry of the AMR resistors.

In a well-designed AMR sensor, the magnetic material is designed to have a preferential magnetization orientation referred to as the "easy axis" of the material. As a result, under a zero magnetic field, the material will be magnetized along the easy axis. As a magnetic field is introduced, however, the magnetization of the material will rotate toward the external magnetic field. The stronger the field, the more the magnetization will rotate away from the easy axis as shown in FIG. 1b.

Magnetic field sensors are designed to operate over a defined full-scale range. The full-scale range of a sensor is the range of values between the minimum and the maximum values that the sensor can accurately measure. In an ideal sensor, if the input stimulus is outside of the full-scale range, the output of the sensor clips to the max and min of the full-scale range, as shown in FIG. 2. In many instances, this clipping is perceived as being beneficial because it provides information to indicate that the sensor is saturated and, therefore, its measurement outputs are suspect.

When the external magnetic field becomes higher than the saturation field of AMR material, however, the resistance is no longer a function of the field strength and is instead only a function of the field orientation. As a result, AMR sensors do not clip when the measured magnetic field exceeds the full-scale range. Instead, the sensor output will tend to drop to zero as the magnetic material goes into saturation, as shown in FIG. 3. Thus, looking at the output of an AMR sensor, one cannot tell if the device is in saturation.

What is needed, therefore, is a better approach to determining when an AMR sensor is in magnetic saturation.

BRIEF SUMMARY OF THE INVENTION

AMR-based magnetic sensors have a region in which the output is a linear response to the magnetic field. When approaching magnetic saturation, and prior to reaching saturation, however, the output response "re-traces" back to zero but with a different slope. If the sensor is completely saturated it reads close to zero so it is possible to detect this condition. A problem can arise, however, when the device is saturated, but still responding, as the same value could be reported for two different fields, one in the linear region and one in the saturation region. It is important to know if the device is operating in the linear region and has not exceeded the maximum response and that the sensor is on its way back to zero. The concepts and systems described herein provide a determination that the device is operating in the linear region.

In one embodiment, a method of detecting magnetic field saturation of an AMR-based magnetic field sensing system includes orienting a first sensitive axis of a first magnetic field sensing device along a first virtual line; orienting a second sensitive axis of a second magnetic field sensing device along a second virtual line at a first angle $\alpha$ relative to the first virtual line; and comparing a first output signal representing a magnetic field detected by the first sensing device to a second output signal representing a magnetic field detected by the second sensing device to determine if at least one of the first and second sensing devices is magnetically saturated.

In another embodiment, a method of detecting magnetic field saturation of an AMR-based magnetic field sensing device includes: obtaining a first output signal representing a magnetic field detected by the sensing device; generating a magnetic bias field of a predetermined intensity adjacent the sensing device and obtaining a second output signal representing a magnetic field detected by the sensing device while generating the magnetic bias field; and comparing the first and second output signals and if a difference therebetween is not of a predetermined amount then determining that the sensing device is in magnetic saturation.

In yet another embodiment, a method of detecting magnetic field saturation of an AMR-based magnetic field sensing system includes: orienting a first sensitive axis of a first magnetic field sensing device along a first virtual line, the first sensing device having a first dynamic range; orienting a second sensitive axis of a second magnetic field sensing device along a second virtual line parallel to the first virtual line, the second sensing device having a second dynamic range different from the first dynamic range; and comparing a first output signal representing a magnetic field detected by the first sensing device to a second output signal representing a magnetic field detected by the second sensing device to determine if at least one of the first and second sensing devices is magnetically saturated.

BRIEF DESCRIPTION OF THE SEVERAL VIEWS OF THE DRAWINGS

Various aspects of at least one embodiment of the present invention are discussed below with reference to the accompanying figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals, where used, may be repeated among the drawings to indicate corresponding or analogous elements. For purposes of clarity, however, not every component may be labeled in every drawing. The figures are provided for the purposes of illustration and explanation and are not intended as a definition of the limits of the invention. In the figures.

DETAILED DESCRIPTION OF THE INVENTION

Figure 1A:
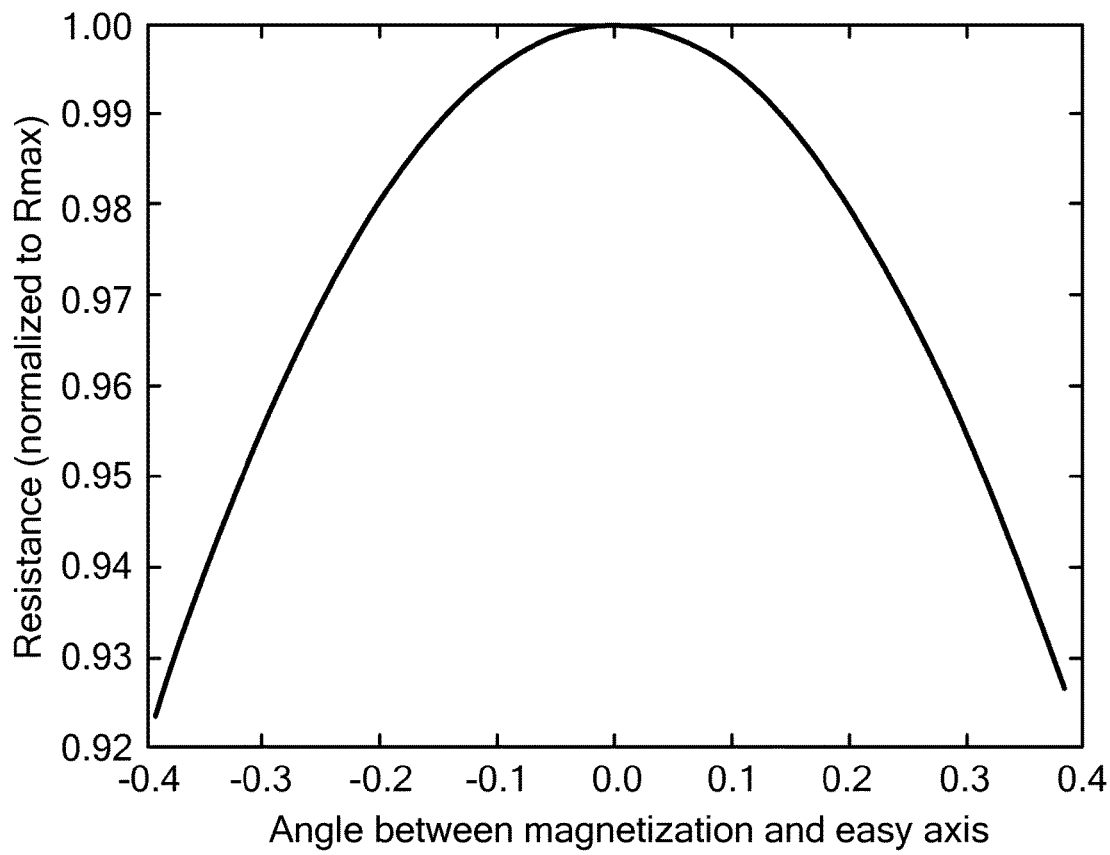
FIGS. 1a and 1b represent the resistance of an AMR device as a function of magnetization angle and the vector definitions, respectively.
Figure 1B:
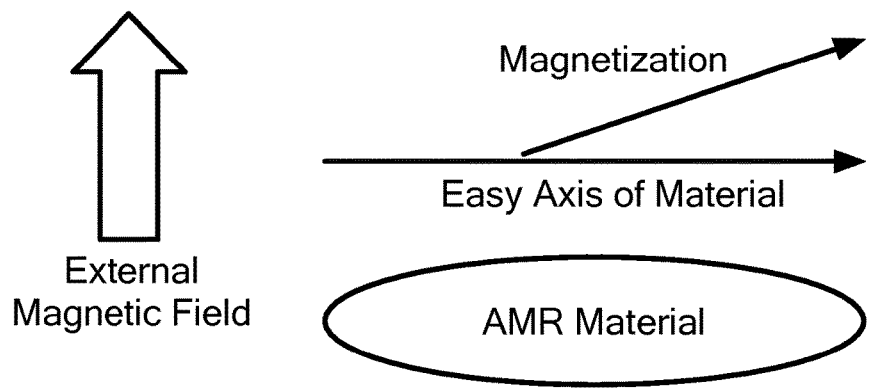
Figure 2:
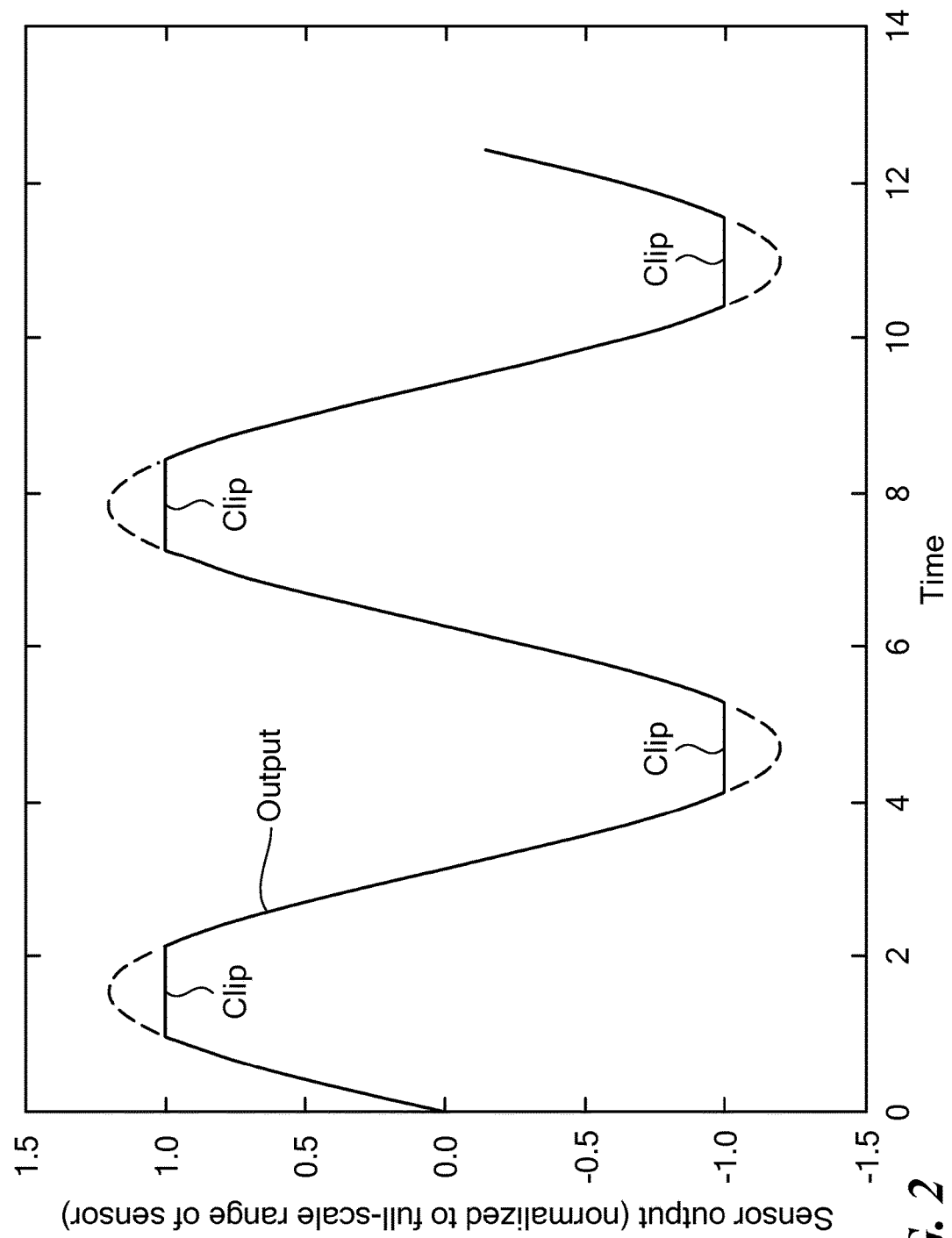
FIG. 2 is a graph showing the output of a magnetic field sensor clipped to a full-scale range minimum and maximum value.
Figure 3:
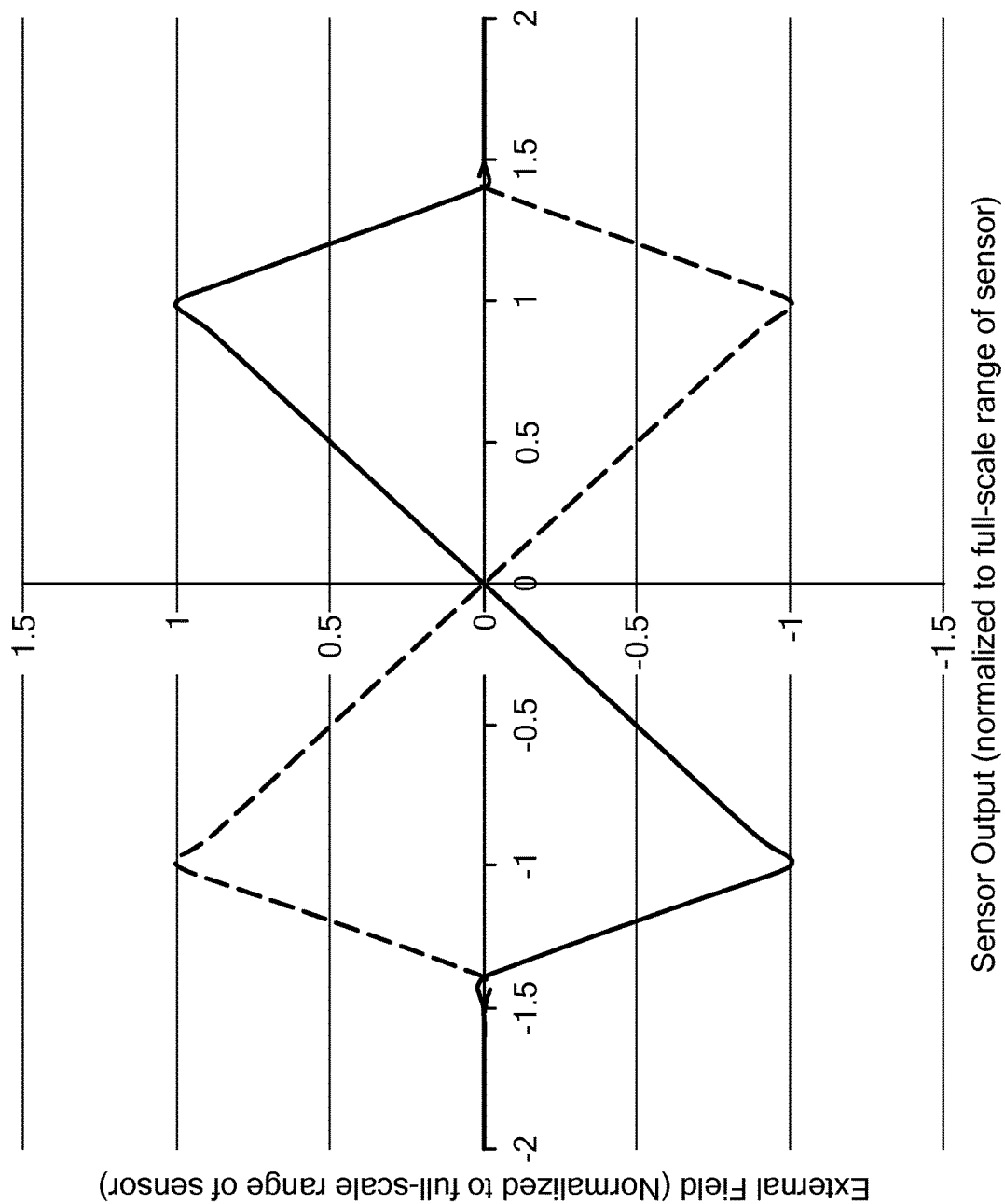
FIG. 3 is a graph of the output of an AMR sensor as a function of external magnetic field representing the effects on the device in saturation.

The entire contents of U.S. Provisional Patent Application Ser. No. 61/906,093 filed on Nov. 19, 2013 and titled "Magnetic Sensor Saturation Detection," is incorporated by reference herein for all purposes.

In the following detailed description, numerous specific details are set forth in order to provide a thorough understanding of the embodiments of the present invention. It will be understood by those of ordinary skill in the art that these embodiments of the present invention may be practiced without some of these specific details. In other instances, well-known methods, procedures, components and structures may not have been described in detail so as not to obscure the embodiments of the present invention.

Prior to explaining at least one embodiment of the present invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein are for the purpose of description and should not be regarded as limiting.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination.

As known to those of skill in the art, to measure a magnetic field using an AMR resistor or device, electric current flows through the AMR resistor, and an external magnetic field, for example, earth's local magnetic field, modifies the magnetization vector and changes the resistance value of the AMR device.

Figure 4:
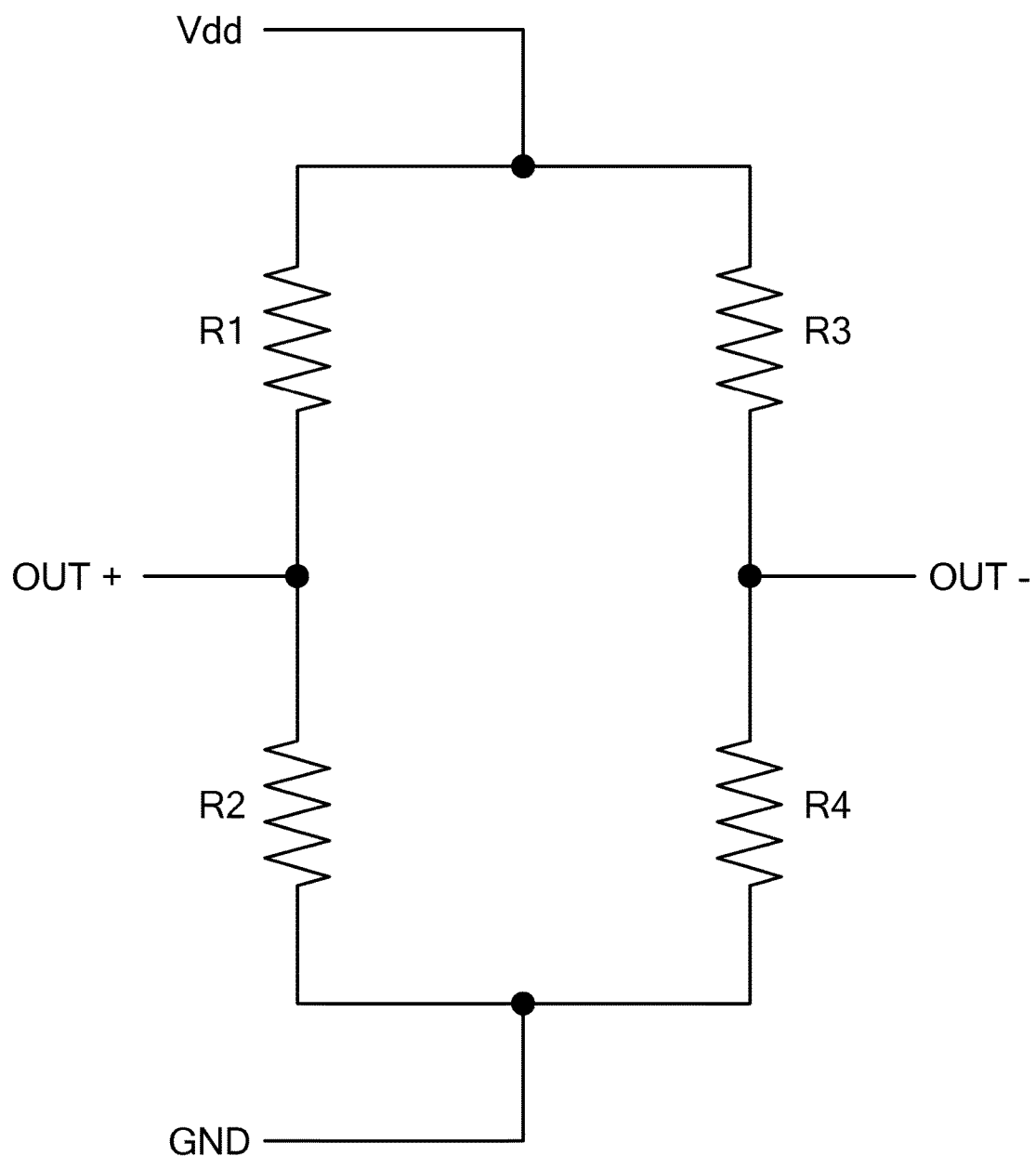
FIG. 4 is an electrical circuit diagram of a Wheatstone Bridge comprising AMR devices.

Referring now to FIG. 4, four such AMR resistors R1-R4 are constructed in a Wheatstone bridge configuration. The circuit shown in FIG. 4 represents one magnetic sensor and is meant to detect magnetization in one magnetic field axis when appropriately oriented. In order to detect the magnetic fields in each of the X, Y and Z axes, therefore, three such circuits would be provided, and oriented, with respect to each other in order to make such measurements as one of ordinary skill in the art would understand. While a Wheatstone bridge configuration is described here, there are other configurations that could be implemented and the teachings presented herein are not limited to such a structure. In the description to follow, reference is made to an AMR sensor and such sensor can be one of many known AMR devices and/or structures.

Generally, the four AMR resistors are matched to one another in the bridge circuit and, therefore, in the absence of an external magnetic field, the bridge is balanced and produces a near zero voltage difference between the two output nodes OUT+ and OUT−. In the presence of an external magnetic field, the respective resistance of each AMR resistor changes in accordance with the magnetic field magnitude and polarity so that a differential voltage signal appears on the two output nodes OUT+ and OUT−.

Figure 5:
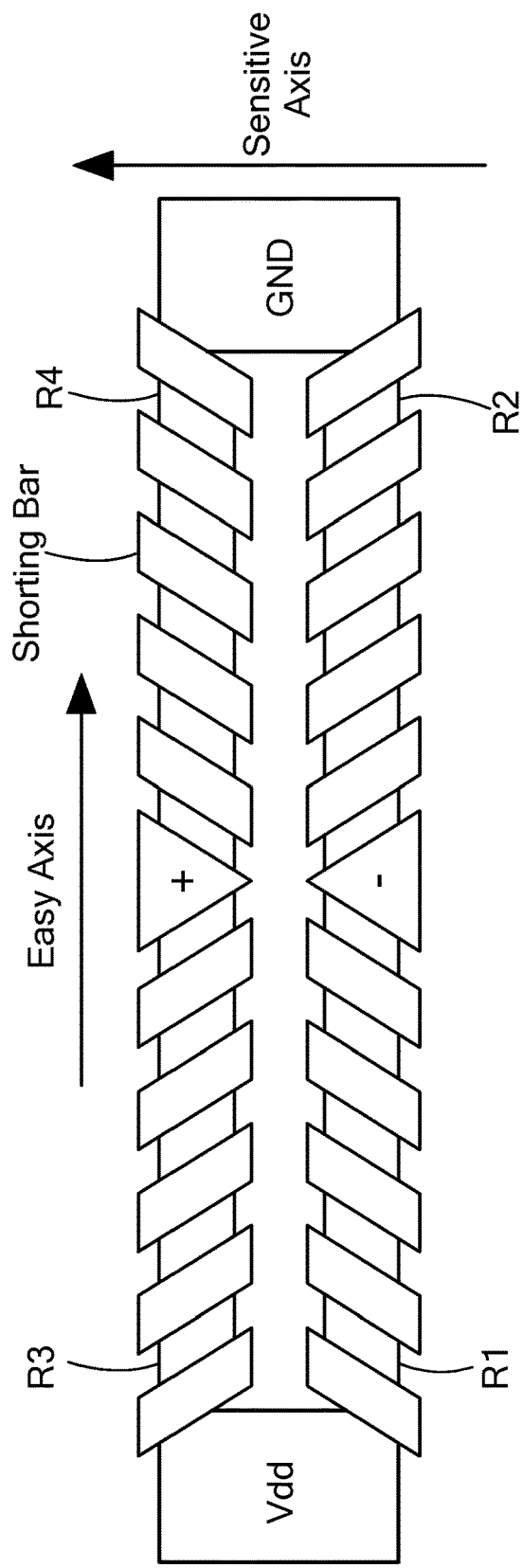
FIG. 5 is a representation of the Wheatstone Bridge of FIG. 4 implemented with barber-pole structures.

The bridge circuit represented in FIG. 4, may be implemented where each of the AMR resistors R1-R4 is constructed with shorting bars added following the permalloy fabrication steps, as shown in FIG. 5. As known, these shorting bars are common in AMR sensors and resistors in order to form what are referred to as "barber pole" structures that linearize the sensor output with respect to an external field. A SET coil, not shown, may be provided to set an initial magnetization vector direction as part of a calibration system but is not relevant to the present discussion.

AMR Saturation Detection by Combining Sensors with Different Full-Scale Ranges

In one embodiment of the present invention, two or more magnetic sensors with different respective full-scale ranges are provided to determine if one or both are in saturation. The vector sum of the two or more sensors with different dynamic ranges will be equal (within tolerance of the sensor) when all sensors are within their full-scale range. If one or more sensors are saturated, the vector sums of the sensors will no longer be equal.

Figure 6:
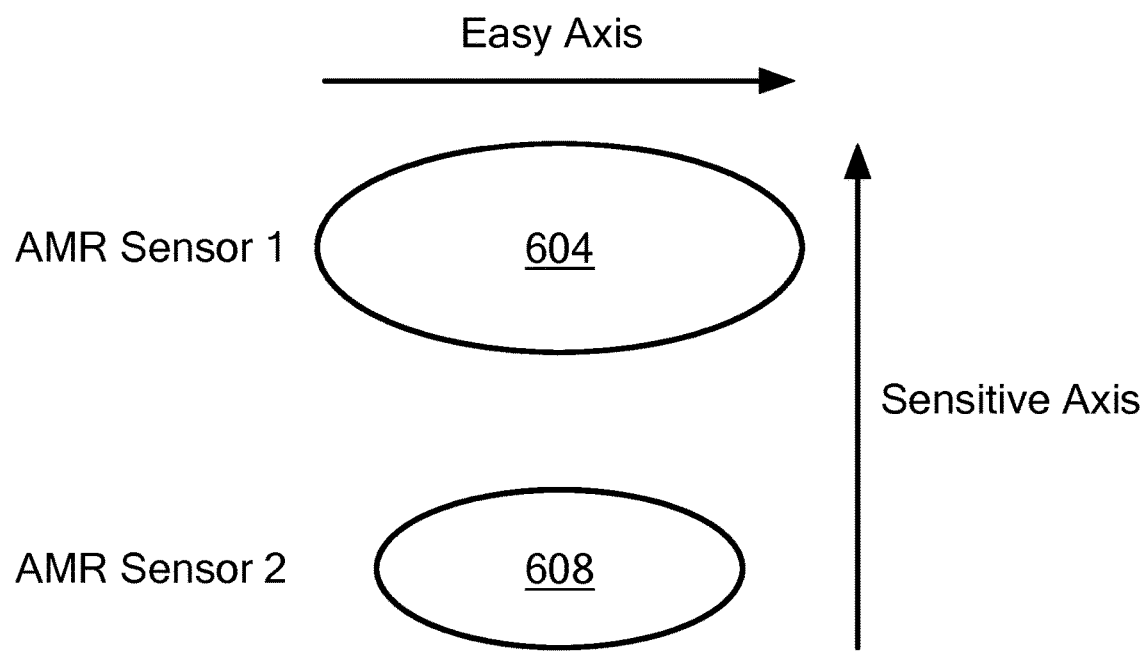
FIG. 6 is a representation of two AMR sensors of different dynamic ranges.
Figure 7:
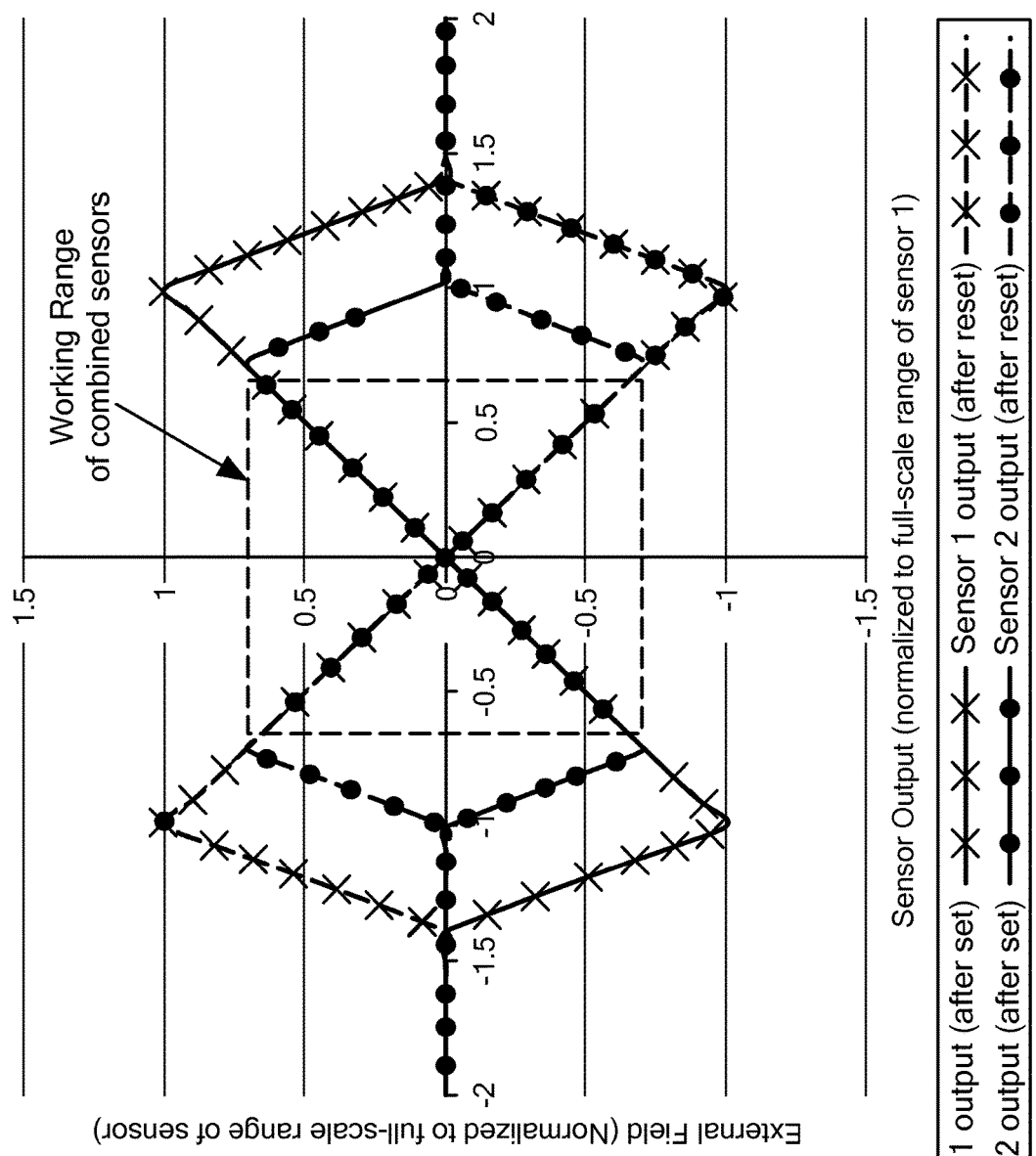
FIG. 7 is a graph showing the corresponding outputs from AMR sensors with different dynamic ranges as presented in FIG. 6.

Referring now to FIG. 6, two separate sensors 604, 608 are mounted in close proximity to each other. Alternately, the multiple sensor elements may be patterned on the same die. It should be noted that two sensors are represented here for explanatory purposes only and not meant to be limited as there may be more than two sensors provided. As an example, the first sensor 604 may have a larger dynamic range than the second sensor 608. The operational range of the combined sensor will be equal to the full-scale range of the sensor with the smaller full-scale range, as shown in FIG. 7.

In operation, therefore, the respective outputs of the sensors 604, 608 are compared to one another. Such a comparison may be implemented by discrete components in an analog implementation or converted to digital signals by operation of an analog-to-digital converter (ADC) in conjunction with a microprocessor, or similar processing device, as would be understood by those of ordinary skill in the art.

Any determination of saturation would then be conveyed as a signal, for example, thus alerting to the magnetic saturation condition.

AMR Saturation Detection Using DC Current

In another embodiment of the present invention, magnetic field saturation of an AMR device is detected by applying a DC offset to the device and observing if the sensor output moves by the predicted offset.

Figure 8:
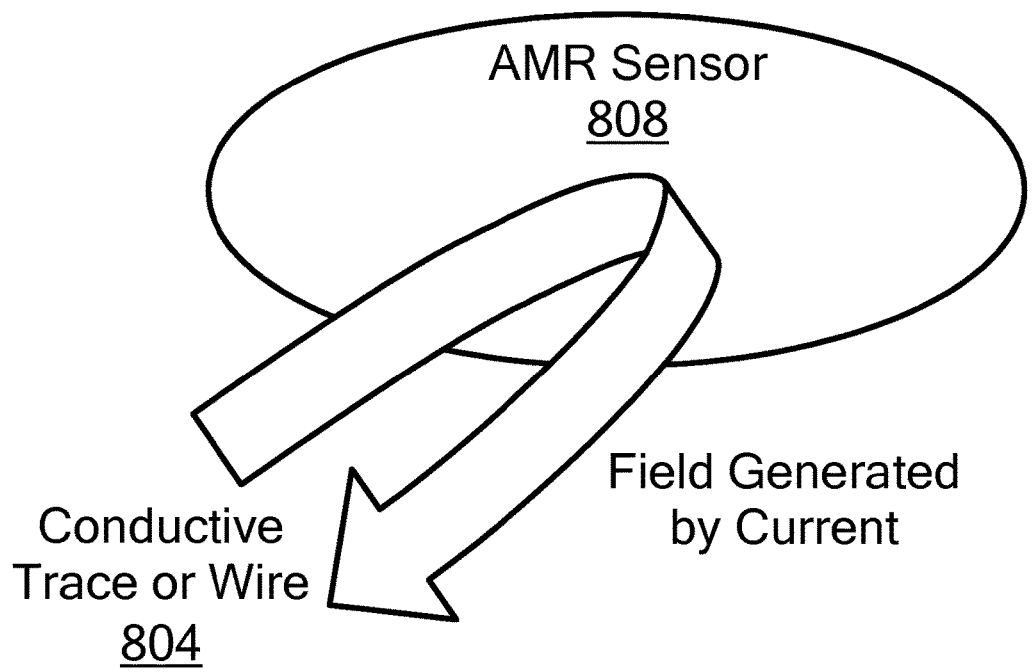
FIG. 8 is a representation of an embodiment of the present invention where a conductive trace is disposed near an AMR sensor.
Figure 8:
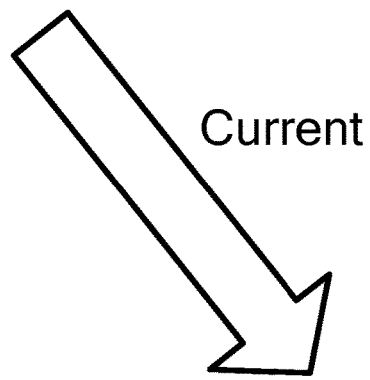

Conceptually, referring now to FIG. 8, a conductive trace or wire 804 is provided adjacent an AMR sensor 808. In one embodiment, this is achieved, for example, by patterning a trace, or conductor, either on-chip, in the package, or on the PCB, to be used as an AMR saturation sensor. The conductive trace is arranged, in one embodiment, parallel to the easy axis of the sensor 808 or at a predetermined angle with respect thereto.

Figure 9A:
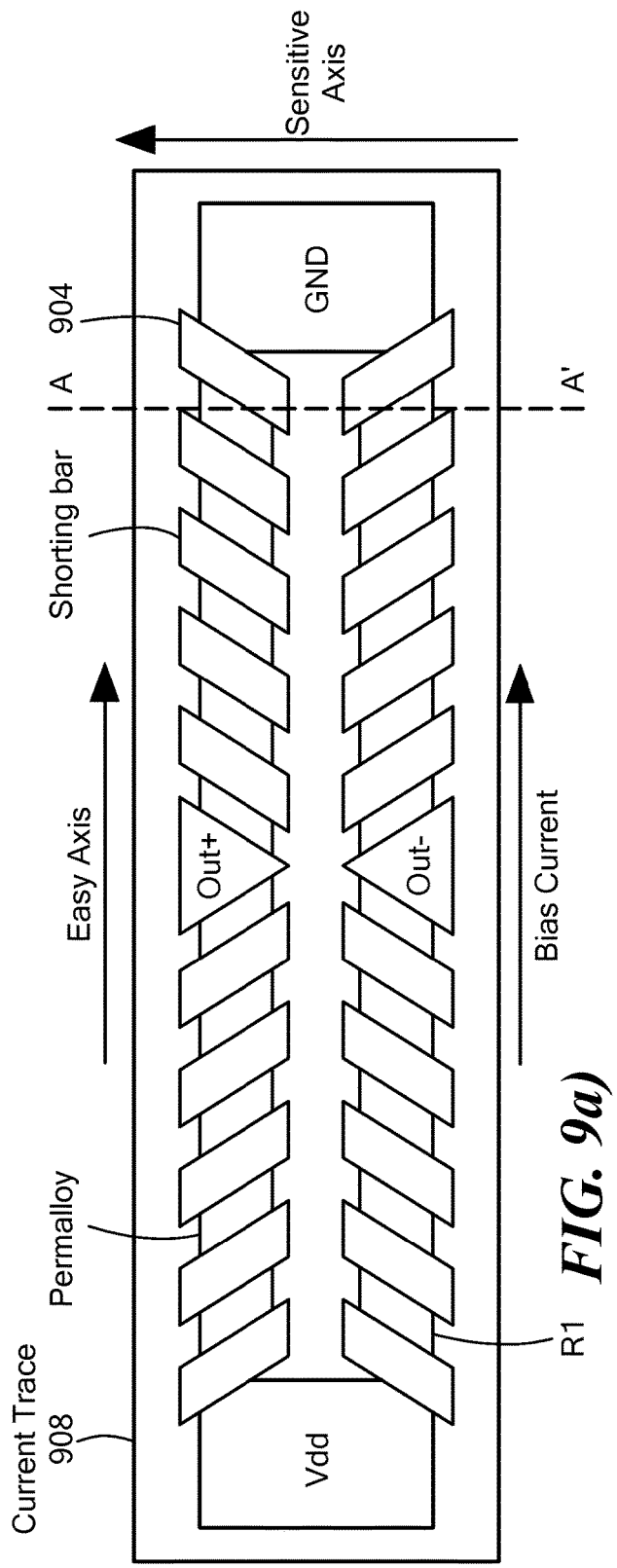
FIG. 9a represents a structure of the embodiment shown in FIG. 8.
Figure 9B:
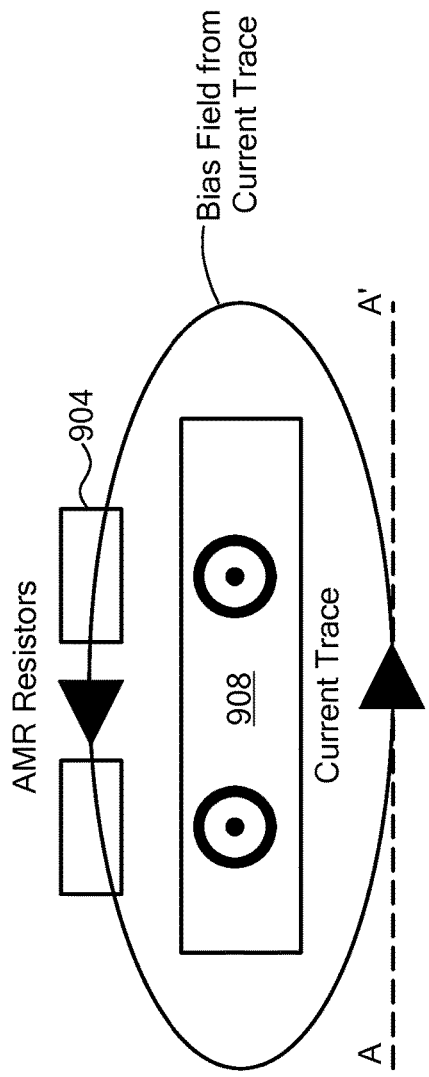
FIG. 9b is a cross-section of FIG. 9a taken along line A-A' in FIG. 8.

As shown in FIGS. 9a and 9b, in one embodiment of the present invention, a barber-pole AMR sensor 904, in a bridge configuration as described above, is provided. A current trace 908 is provided in a plane "below" the sensor 904. It should be noted that the reference to "below" is only a relative description and does not reflect a required arrangement with respect to the direction of gravity. In one embodiment, the current trace 908 is arranged to run longitudinally and parallel to the easy axis of the sensor 904 so that a current within the trace 908 runs parallel with the easy axis.

Figure 10:
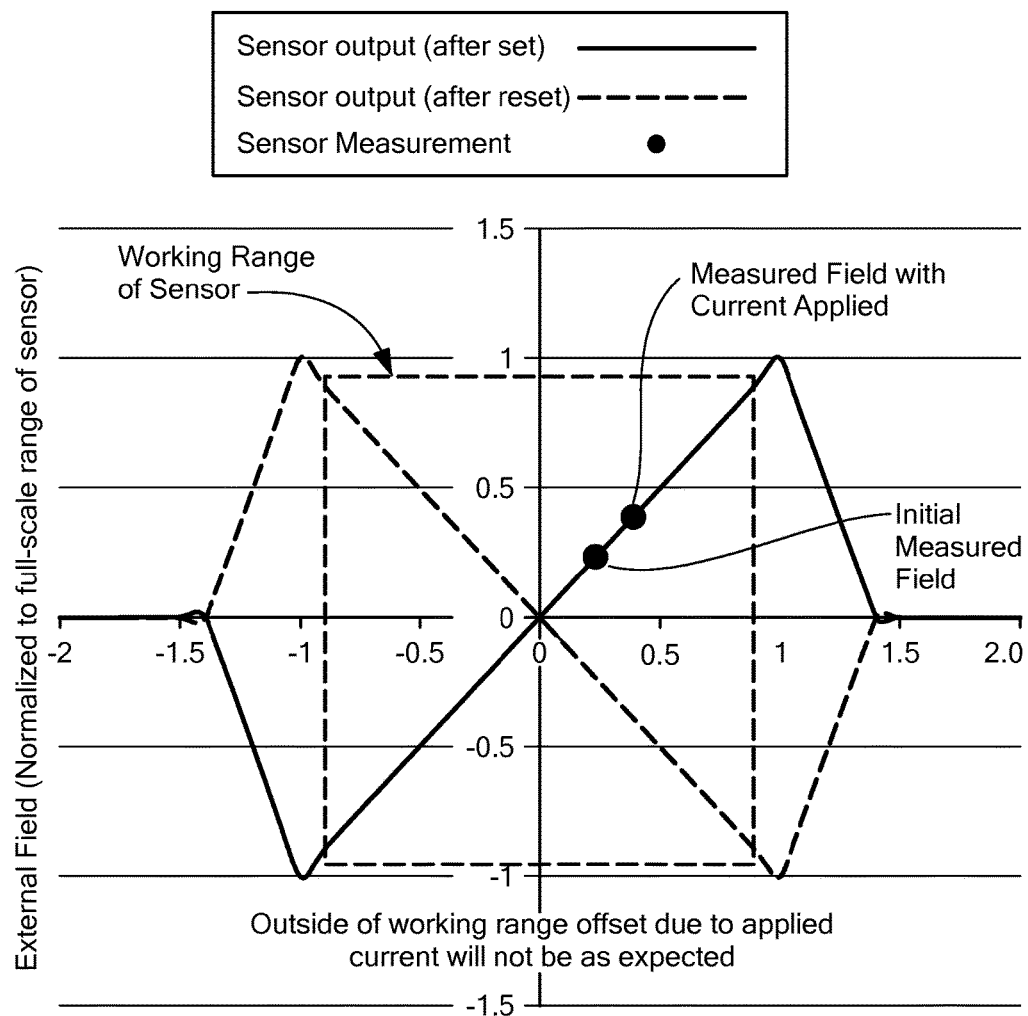
FIG. 10 is a graph showing operation of the embodiment shown in FIG. 8.

In operation, a first measurement of the magnetic field is made with no current on the trace 908. Subsequently, a small amount of current is provided on the trace 908. As shown in FIG. 9B, providing a known current in the trace 908 causes a known magnetic field to be provided adjacent the sensor 904, effectively operating as a bias magnetic field. While the current is flowing in the trace 908, a second measurement is made. Because the trace 908 is at a known distance from the sensor 904 and a known current is applied, if the device is not in saturation, the magnetic field measured by the sensor 904 should be different by a known amount, as presented in FIG. 10. If, however, the sensor 904 is saturated, the bias field from the trace will not change the sensor output as was expected.

If the sensor is completely saturated, i.e., the output is zero, then the applied magnetic field from the current in the trace 908 will have no effect. If the field is on the steep downward slope of the transfer curve, the offset field will change the output opposite of what is expected and at a larger rate.

AMR Saturation Detection Using Permanent Magnet DC Bias

As discussed above, when an AMR sensor goes into saturation, the output value drops from a maximum output reading down to a reading close to zero. As a result, when a sensor is providing a very small output value for the magnetic field, a user cannot determine if the sensor is saturated or if it is measuring a very small magnetic field.

Figure 11:
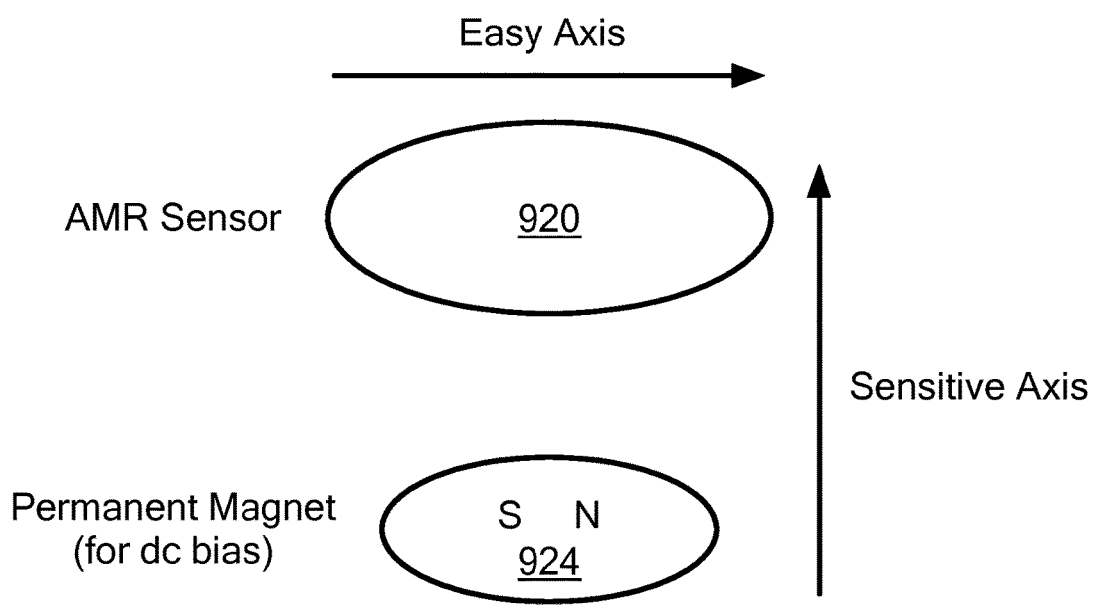
FIG. 11 is a representation of an embodiment of the present invention where a permanent magnet is disposed near an AMR sensor.

Referring now to FIG. 11, an AMR sensor 920 is provided and a permanent magnet 924, for DC bias, is provided adjacent to the sensor 920. The magnet 924 may be a hard ferromagnetic material but is not limited to such material. The magnet 924 may be oriented in a predetermined arrangement with respect to the easy axis of the sensor 920, for example, the N-S line of the magnet could be set to be parallel to the easy axis or provided at some other desired angle. The magnet 924 is placed, for example, either on the die, in the package or on the PCB such that the AMR sensor 920 is placed within the bias magnetic field of the magnet 924.

Figure 12:
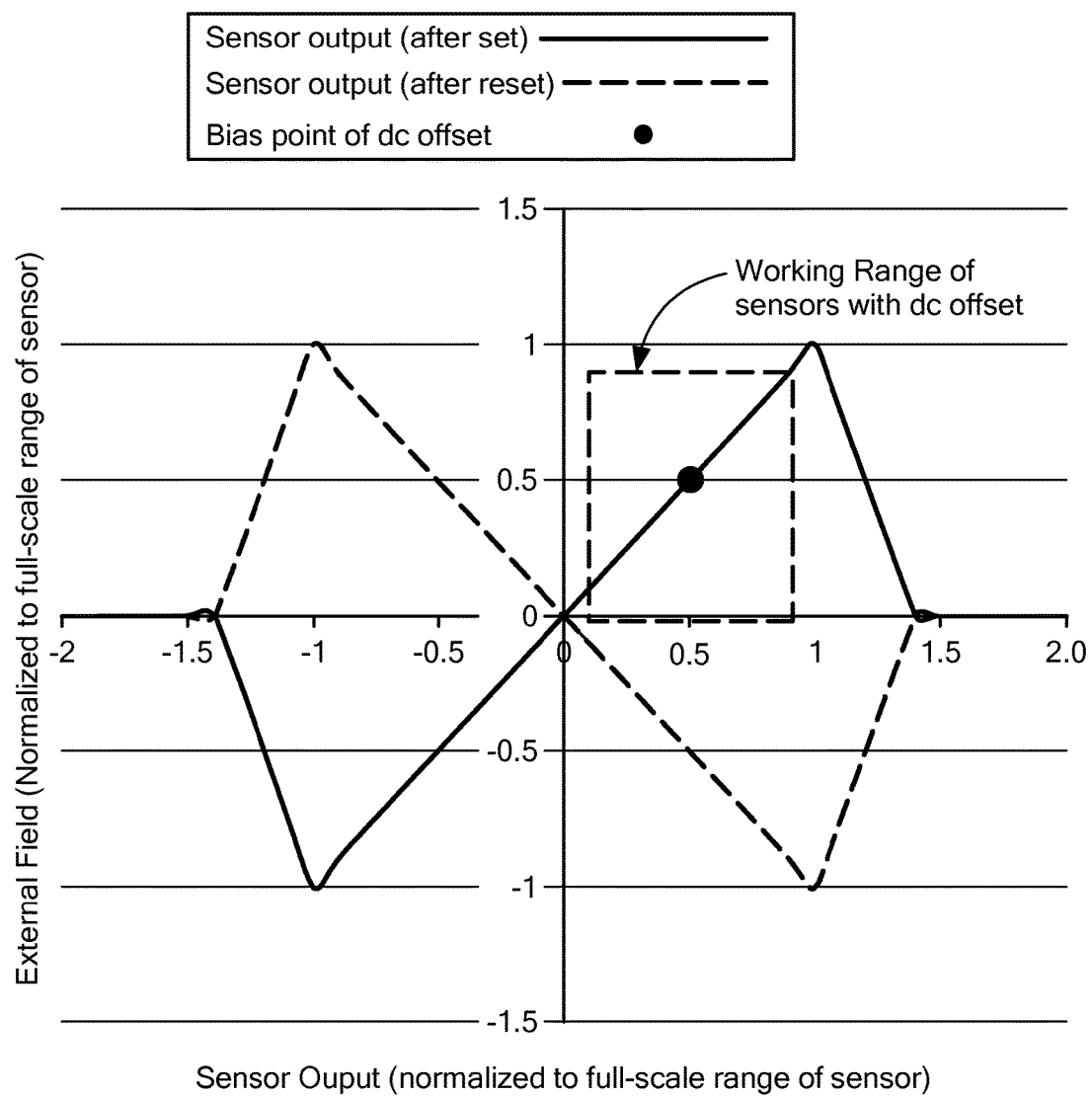
FIG. 12 is a graph showing operation of the embodiment shown in FIG. 11.

In this configuration, the sensor 920 will output a reading equal to the bias magnetic field when there is no external magnetic field present, as shown in FIG. 12. Advantageously, with this embodiment the user can assume that any indication of a magnetic field close to zero is the result of a saturated sensor 920.

AMR Saturation Detection by Arranging Sensitive Axes at 45° Offsets

The magnetic field strength required to saturate an AMR-based magnetic sensor depends upon the orientation of the field relative to the sensitive axis of the sensor. Saturation occurs earliest when the field is at 45° with respect to the sensitive axis.

Figures 13A, 13B, 13C:
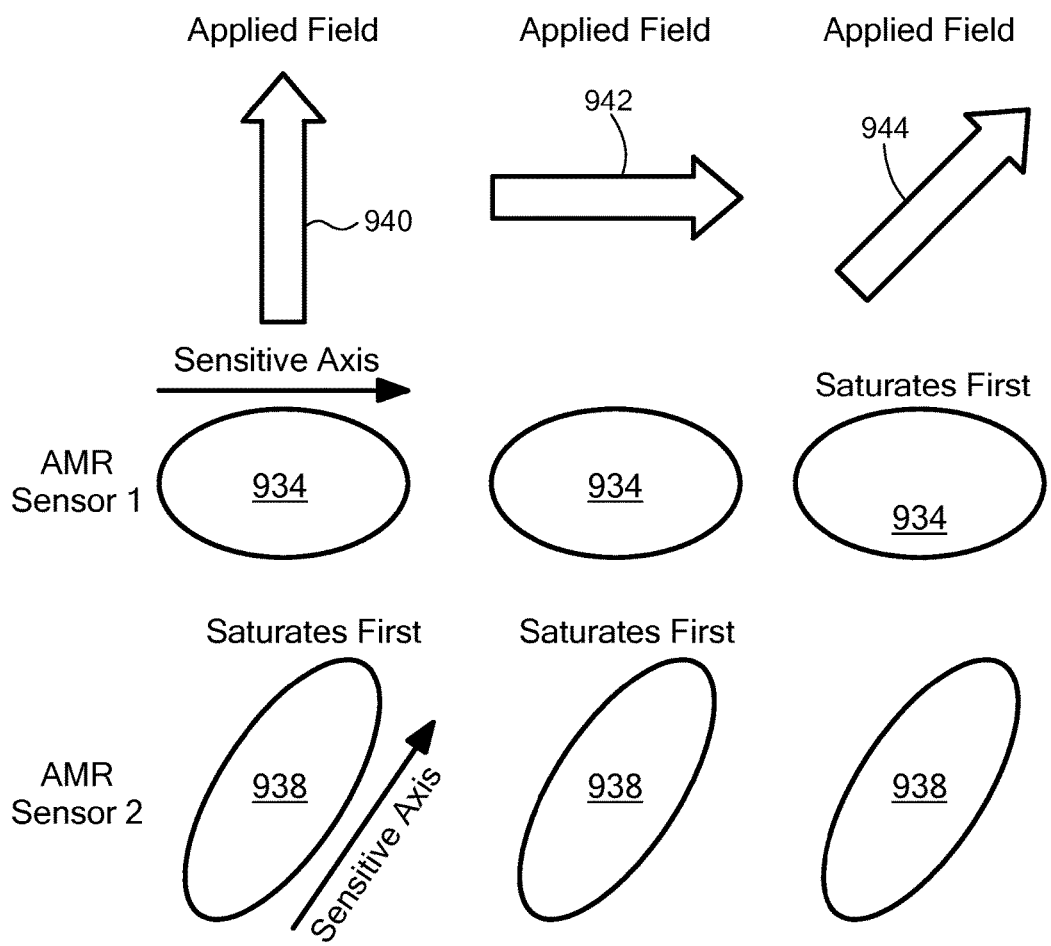
FIGS. 13a-13c are representations of an embodiment of the present invention where the sensitive axes of multiple AMR sensors are arranged at 45° offsets with respect to one another.

As shown in FIGS. 13a-13c, by mounting two AMR sensors 934, 938 such that the sensitive axes are at 45° with respect to each other, it is assured that the devices will not saturate at the same time in the same field. Advantageously, by comparing the outputs of the two sensors, or the vector sums if multi-axis systems are implemented, it can be determined if one or more of the devices is in magnetic saturation.

Thus, as shown in FIG. 13a, when an applied saturating magnetic field 940 is perpendicular to the sensitive axis of the first sensor 934, then the second sensor 938 will saturate first. Referring now to FIG. 13b, when an applied saturating magnetic field 942 is parallel to the sensitive axis of the first sensor 934, then the second sensor 938 will saturate first. Finally, when an applied saturating magnetic field 944 is at an angle between 0° and 90° with respect to the sensitive axis of the first sensor 934, then the first sensor 934 will saturate first. Each of these conditions can be detected in order to determine a saturation condition.

Figure 14:
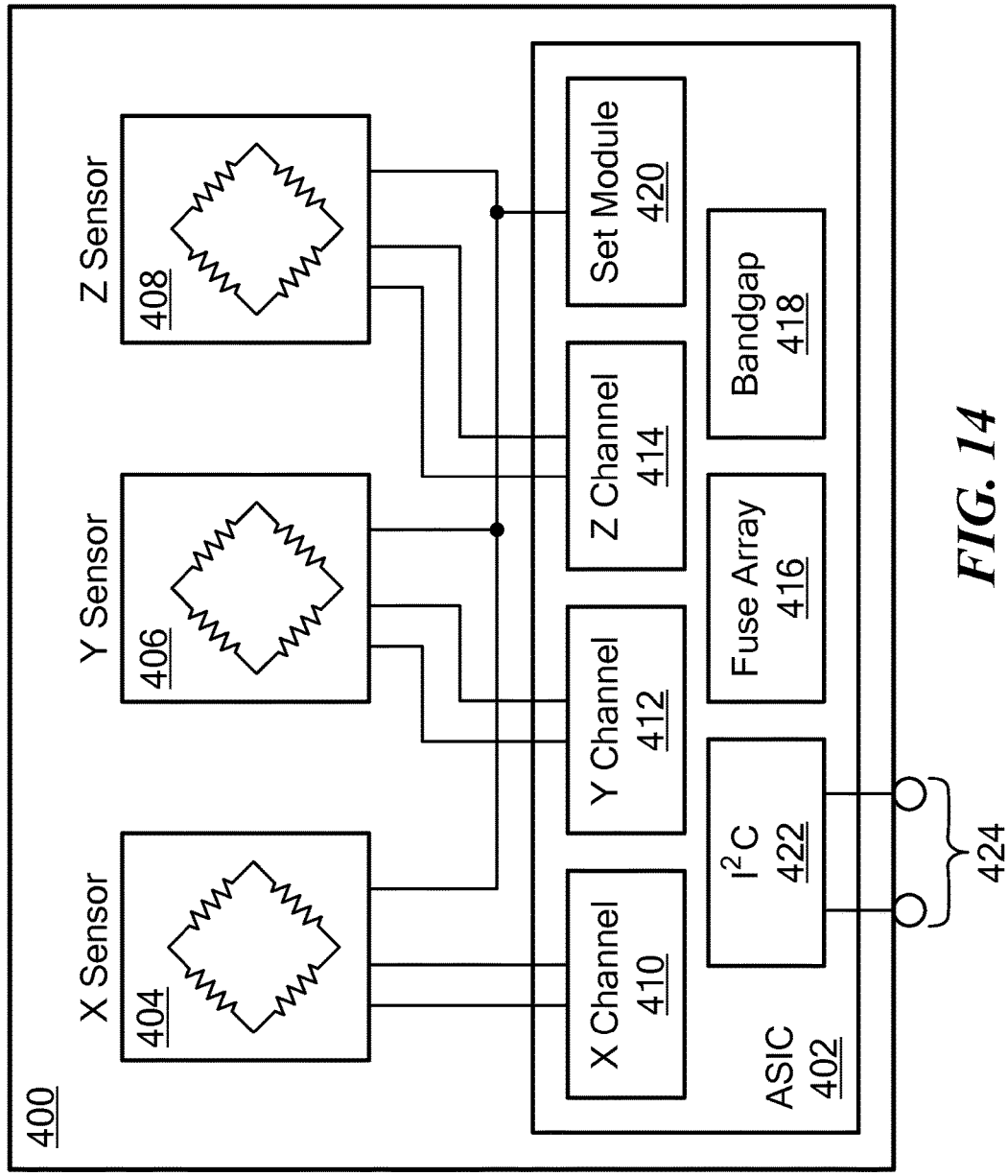
FIG. 14 is a functional block diagram of a system in accordance with one or more embodiments of the present invention.

One or more of the embodiments of the present invention described above may be implemented in a system 400 as shown in FIG. 14, where a mixed-signal ASIC 402 interfaces with three separate sensors 404, 406 and 408, i.e., one for each of the X, Y and Z axes, to provide a complete magnetic field measurement system. In one embodiment, the ASIC 402 is designed with 0.6 micrometer (μm) CMOS processes with three metal layers and two polysilicon layers. The chip area is approximately 2.5 mm by 1.7 mm. The differential voltage signals OUT+ and OUT− from each of the AMR Wheatstone bridges in the sensors 404, 406, 408 are fed respectively into three identical signal processing channels 410, 412, 414 that provide low noise amplification, offset adjustment, sensitivity adjustment, temperature compensation and analog to digital conversion.

Thus, the comparison operations and detection of saturation may be incorporated into the ASIC 402 or conveyed to a microprocessor (not shown). The saturation detection components may be incorporated into the separate sensors 404, 406 and 408 or they may be provided separately with their own data lines and connections. One of ordinary skill in the art will understand how this incorporation could be accomplished and the details need not be described further here.

Each device 400 is individually adjusted and tested for parameters such as sensitivity, offset, biasing voltage, oscillator frequency, etc. Calibration information may be stored inside a fuse array 416 during a factory trimming process. A band gap/biasing circuit 418 may be provided to set the internal reference voltage as well as the biasing currents for analog circuits and sensor bridges. On-chip driver transistors in a SET module portion 420 provide nominal current for the SET coil. The energy required during the SET event may be stored in an external capacitor (not shown) that is continuously charged from the power supply. An I²C digital communications module 422 is operated in FAST mode, i.e., up to a 400 KHz clock rate, and eliminates the need for an external analog digital converter and provides a two-pin I²C interface 424 to an external MCU.

In one embodiment of the present invention, in normal operation, the ASIC 400 is in a dormant state with virtually no power consumption except for leakage current. When a demand for measurement is initiated by a system MCU, a measurement command is sent through the I²C interface 424. In addition, actions will be triggered by such commands as to execute a SET operation, biasing of the sensor bridge, an analog to digital conversion, detection of saturation, etc. The measurement result is then stored in on-chip registers provided in the I²C module 422 waiting to then be transferred to a system MCU.

Having thus described several features of at least one embodiment of the present invention, it is to be appreciated that various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A method of determining magnetic field saturation of an AMR-based magnetic field sensing system, the method comprising:
   receiving a first output signal representing a magnetic field as detected by a first sensing device oriented along a first sensitive axis of the first magnetic field sensing device along a first virtual line, wherein the first magnetic field sensing device is a first multi-axis sensing device and has a first dynamic range;
   receiving a first output signal representing a magnetic field as detected by a second sensing device oriented along a second sensitive axis of the second magnetic field sensing device along a second virtual line at a first angle α relative to the first virtual line, wherein the second magnetic field sensing device is a second multi-axis sensing device and has a second dynamic range, the first dynamic range being different from the second dynamic range;
   determining whether a vector sum of the first output signal representing the magnetic field as detected by the first sensing device is equal to a vector sum of the second output signal representing the magnetic field as detected by the second sensing device; and
   in response to determining that the vector sum of the first output signal is not equal to the vector sum of the second output signal, generating a signal indicating at least one of the first and second sensing devices is magnetically saturated.

2. The method of claim 1, further comprising:
   arranging the first and second magnetic field sensing devices in a same plane.

3. The method of claim 1, further comprising:
   setting the first angle α to be a value in a range where 0°<α<90°.

4. The method of claim 1, further comprising:
   arranging the first and second sensing devices such that α=45°.

5. The method of claim 1, wherein the first magnetic field sensing device comprises a first anisotropic magnetoresistive (AMR) Wheatstone bridge and the second magnetic field sensing device comprises a second AMR Wheatstone bridge.

6. The method of claim 5, wherein the first output signal comprises first differential voltage signals, OUT+ and OUT−, from the first AMR Wheatstone bridge and the second output signal comprises second differential voltage signals, OUT+ and OUT−, from the second AMR Wheatstone bridge.

7. The method of claim 6, further comprising converting the first differential voltage signals and the second differential voltage signals to digital signals.

8. The method of claim 1, wherein the first dynamic range represents a first range of values between a first minimum value and a first maximum value between which the first sensing device can accurately measure magnetic field strength, and
   wherein the second dynamic range represents a second range of values between a second minimum value and a second maximum value between which the second sensing device can accurately measure magnetic field strength.

9. The method of claim 8, wherein the first dynamic range being different from the second dynamic range when at least one of:
   the first minimum value is different from the second minimum value, and
   the first maximum value is different from the second maximum value.

10. A method of determining magnetic field saturation of an AMR-based magnetic field sensing device, the method comprising:
    obtaining a first output signal representing a measurement of a first magnetic field detected by the sensing device, wherein the sensing device is a multi-axis sensing device;
    generating a magnetic bias field of a predetermined intensity adjacent the sensing device and obtaining a second output signal representing a measurement of a second magnetic field detected by the sensing device, the second magnetic field comprising the first magnetic field and the magnetic bias field;
    determining whether a vector sum of the first output signal is different from a vector sum of the second output signal by a predetermined amount; and
    in response to determining that the vector sum of the first output signal is not different from the vector sum of the second output signal by the predetermined amount, generating a signal indicating that the sensing device is in magnetic saturation.

11. The method of claim 10, wherein generating the magnetic bias field comprises running a current through a conductor adjacent to the sensing device.

12. The method of claim 11, further comprising:
orienting the conductor such that the current runs substantially parallel to an easy axis of the sensing device.

13. The method of claim 10, wherein the sensing device comprises an anisotropic magnetoresistive (AMR) Wheatstone bridge.

14. The method of claim 13, wherein the first output signal comprises differential voltage signals, OUT+ and OUT−, from the AMR Wheatstone bridge.

15. The method of claim 13, wherein the sensing device further comprises a current trace in a plane adjacent to the AMR Wheatstone bridge, and
wherein generating the magnetic bias field comprises applying a current to the current trace.

16. A method of determining magnetic field saturation of an AMR-based magnetic field sensing system, the method comprising:
receiving a first output signal representing a magnetic field as detected by a first sensing device oriented along a first sensitive axis of the first magnetic field sensing device along a first virtual line, the first sensing device is a first multi-axis sensing device having a first dynamic range;
receiving a second output signal representing the magnetic field as detected by a second sensing device along a second sensitive axis of the second magnetic field sensing device oriented along a second virtual line parallel to the first virtual line, the second sensing device is a second multi-axis sensing device having a second dynamic range different from the first dynamic range;
determining whether a vector sum of the first output signal representing the magnetic field as detected by the first sensing device is equal to a vector sum of the second output signal representing the magnetic field as detected by the second sensing device; and
in response to determining that the vector sum of the first output signal is not equal to the vector sum of the second output signal, generating a signal indicating at least one of the first and second sensing devices is magnetically saturated.

17. The method of claim 16, wherein the first magnetic field sensing device comprises a first anisotropic magnetoresistive (AMR) Wheatstone bridge and the second magnetic field sensing device comprises a second AMR Wheatstone bridge.

18. The method of claim 17, wherein the first output signal comprises first differential voltage signals, OUT+ and OUT−, from the first AMR Wheatstone bridge and the second output signal comprises second differential voltage signals, OUT+ and OUT−, from the second AMR Wheatstone bridge.

19. The method of claim 18, further comprising converting the first differential voltage signals and the second differential voltage signals to digital signals.

* * * * *